United States Patent
Hold et al.

(10) Patent No.: US 7,830,176 B2
(45) Date of Patent: Nov. 9, 2010

(54) CONTROLLING SIGNAL LEVELS ON A SIGNAL LINE WITHIN AN INTEGRATED CIRCUIT

(75) Inventors: Betina Hold, El Dorado Hills, CA (US); Stuart Siu, Castro Valley, CA (US)

(73) Assignee: ARM Limited, Cambridge (GB)

( * ) Notice: Subject to any disclaimer, the term of this patent is extended or adjusted under 35 U.S.C. 154(b) by 744 days.

(21) Appl. No.: 11/493,844

(22) Filed: Jul. 27, 2006

(65) Prior Publication Data

US 2008/0029839 A1 Feb. 7, 2008

(51) Int. Cl.
*H03K 19/0175* (2006.01)

(52) U.S. Cl. .............................. 326/86; 326/62; 326/82; 327/200

(58) Field of Classification Search .................... 326/62, 326/82–92; 327/200–218
See application file for complete search history.

(56) References Cited

U.S. PATENT DOCUMENTS

| | | | | |
|---|---|---|---|---|
| 5,440,182 A * | 8/1995 | Dobbelaere | | 326/38 |
| 5,550,499 A * | 8/1996 | Eitrheim | | 327/175 |
| 5,748,015 A * | 5/1998 | Tam | | 327/51 |
| 5,892,372 A * | 4/1999 | Ciraula et al. | | 326/96 |
| 5,942,917 A * | 8/1999 | Chappell et al. | | 326/121 |
| 5,986,475 A * | 11/1999 | Kim et al. | | 326/95 |
| 6,097,216 A * | 8/2000 | Youn | | 326/71 |
| 6,275,069 B1 * | 8/2001 | Chung et al. | | 326/98 |
| 6,496,038 B1 * | 12/2002 | Sprague et al. | | 326/95 |
| 6,531,897 B1 * | 3/2003 | Milshtein et al. | | 326/95 |
| 6,617,892 B2 * | 9/2003 | Krishnamurthy et al. | | 327/112 |
| 6,653,866 B2 * | 11/2003 | Narendra et al. | | 326/95 |
| 6,768,342 B2 * | 7/2004 | Greenstreet et al. | | 326/93 |
| 6,894,549 B2 * | 5/2005 | Eliason | | 327/217 |
| 6,975,134 B2 * | 12/2005 | Kuang et al. | | 326/27 |
| 7,136,311 B2 * | 11/2006 | Fujikawa | | 365/189.11 |
| 7,382,157 B1 * | 6/2008 | Young et al. | | 326/41 |
| 2002/0109528 A1 * | 8/2002 | Toda | | 326/90 |
| 2003/0001616 A1 * | 1/2003 | Fujikawa et al. | | 326/80 |
| 2003/0001617 A1 * | 1/2003 | Taylor et al. | | 326/82 |
| 2004/0164767 A1 * | 8/2004 | Afghahi et al. | | 326/86 |
| 2004/0257112 A1 * | 12/2004 | Hidaka et al. | | 326/82 |
| 2005/0146357 A1 * | 7/2005 | Anders et al. | | 326/86 |
| 2006/0061388 A1 * | 3/2006 | Kuang et al. | | 326/83 |

\* cited by examiner

*Primary Examiner*—James H. Cho
*Assistant Examiner*—Matthew C Tabler
(74) *Attorney, Agent, or Firm*—Nixon & Vanderhye P.C.

(57) ABSTRACT

A signal line 12 has at a first location a first driver 14 to drive a first signal level on that signal line 12. A second driver 16 is provided at a second location, separated from the first location, and serves to drive the line signal to a different value from that driven by the first driver 14. Associated with each of these drivers 14, 16 are respective keeper circuits 18, 20, 22; 24, 26, 28 serving to maintain the signal value driven by the respective remote driver 16; 14. Thus, the first keeper 18, 20, 22 local to the first driver 14 serves to maintain the signal value driven by the second driver 16. The keepers 18, 20, 22; 24, 26, 28 are disabled by the control signal which enables their local driver 14; 16 and thus do not contend with the change being driven by their local driver 14, 16.

20 Claims, 5 Drawing Sheets (a) (b) (c)

(a) (b)

(a)

(b)

CONTROLLING SIGNAL LEVELS ON A SIGNAL LINE WITHIN AN INTEGRATED CIRCUIT

BACKGROUND OF THE INVENTION

1. Field of the Invention

This invention relates to the field of integrated circuits. More particularly, this invention relates to controlling the signal level on a signal line within an integrated circuit.

2. Description of the Prior Art

It is known to provide integrated circuits having nodes for which multiple drivers or control circuits may compete to set the signal value at those nodes. Controlling these drivers such that more than one driver does not attempt to drive the node at any given time is important since such situations would lead to contention which could cause damage and would waste power as well as having other disadvantages. For this reason it is normal to set large amounts of margin between the timings used to control the drivers to ensure that more than one driver is not trying to drive a node at any given time.

As a consequence of the non-overlapping of the drivers in time there are periods during which the node will float in signal level since it is not being actively driven. This can result in unpredictable behaviour and is undesirable. In order to address this, it is known to provide keepers or jam latches which serve to maintain at the node the last set value by the most recently enabled driver.

FIG. 1 of the accompanying drawings shows examples of such keepers and jam latches. Example (a) shows a keeper which will hold a signal line high when it has been driven high by the combined action of an inverter and a p-type transistor in a feedback arrangement. Example (b) is complementary in that it serves to hold a signal value low on a signal line once that signal line has been driven low through the combined action of an inventor and a n-type transistor. Example (c) is a jam latch which serves to hold a signal value either high or low using cross-coupled invertors.

With keepers and jam latches, when a driver is turned on seeking to change the current signal value, then the keeper or jam latch that is trying to maintain the previous value will fight against the driver. For this reason, it is normal to make keepers and jam latches with relatively weak transistors that are easily overcome by the action of the driver circuit. However, as integrated circuits are becoming smaller and using smaller processes (e.g. with circuit element feature sizes down below 90 nm), process variations, temperature ranges and voltage ranges are such that a driver may not be able to overcome a keeper or a jam latch in all situations. This type of failure can be more prominent on long capacitive and resistive signal lines. In these cases, the driver has to overcome the stored charge due to the capacitance of the line or the resistance of the line as well as fight against an active keeper or jam latch.

One approach for dealing with this problem is illustrated in FIG. 2. This shows in example (a) a version of the keeper of FIG. 1, example (a), which has been modified by the inclusion of an additional p-type transistor gated by a control signal. The control signal is used to turn off the feedback action of the keeper circuit and accordingly avoid any contention with a driver circuit. Thus, as the driver circuit starts to drive the signal line (node), the control signal is used to switch off the keeper for that signal line. Example (b) of FIG. 2 shows a modified version of the FIG. 1, example (b) circuit in this case modified by the addition of an n-type transistor controlled by a control signal generated in a co-ordinated fashion with a driver seeking to drive the signal line.

FIG. 3 shows an example (a) of a latch formed as a pass gate associated with a cross-coupled pair of invertors. When the pass gate is closed, the cross-coupled pair of invertors will hold whatever high or low signal they are currently storing. When the pass gate is opened, the cross-coupled invertors need to be overcome if a new signal value is to be written into the latch. An improved circuit is shown in Example (b) in which when the pass gate is opened so that the latch can be written, the feedback to the cross-coupled invertors is switched off so that the cross-coupled invertors no longer fight against any new signal value being driven in through the pass gate.

FIG. 4 shows an example in which a long resistive signal line 2 carries a signal value. A driver 4 at one location on the signal line 2 is used to drive the signal line 2 high. A driver 6 at a separate location on the signal line 2 is used to drive the signal value on the signal line 2 low. A jam latch 8 is provided in the central portion of the signal line 2 to maintain the signal value last driven to the signal line 2. It will be appreciated that the signal line 2 may be relatively long in the context of an integrated circuit such that the drivers 4, 6 are separated from one another and have many other circuit elements disposed therebetween. The signal line 2 can be used to communicate a signal value between different locations within the integrated circuit and these can span a considerable portion of the integrated circuit. For this reason, the technique of FIG. 3, example (b) is difficult to apply in this situation since routing control signals to the jam latch 8 would consume a disadvantageous amount of overhead in terms of circuit area and circuit routing space. The signal line 2 would need to be accompanied by signal lines indicating to the jam latch 8 whether the driver 4 was active or whether the driver 6 was active such that the jam latch 8 could be temporarily disabled.

SUMMARY OF THE INVENTION

Viewed from one aspect the present invention provides an integrated circuit comprising:

a signal line carrying a line signal;

a first signal driver circuit coupled to said signal line at a first location on said integrated circuit, said first signal driver circuit being responsive to a first control signal to drive said line signal to a first signal level;

a second signal driver circuit coupled to said signal line at a second location on said integrated circuit, said second location being separated from said first location with one or more further circuit elements disposed therebetween and said second signal driver circuit being responsive to a second control signal to drive said line signal to a second signal level different to said first signal level;

a first keeper circuit coupled to said signal line at said first location, said first keeper circuit being responsive to said first control signal and to said line signal to maintain said signal line at said second signal level when said first signal driver circuit is not driving said signal line to said first signal level and said second signal driver circuit has driven said line signal to said second signal level; and a second keeper circuit coupled to said signal line at said second location, said second keeper circuit being responsive to said second control signal and said line signal to maintain said signal line at said first signal level when said second signal driver circuit is not driving said signal line to said second signal level and said first signal driver circuit has driven said line signal to said first signal level.

The present technique recognizes that with driver circuits separated from one another on a signal line and seeking to drive the signal level in opposite directions, separate keeper circuits can be associated with each of those drivers and controlled by the control signal for their local driver in order to maintain the signal value driven by the remote driver and yet not contend with their local driver. This advantageously avoids the need to route control signals for the purpose of jam latch or keeper control over large distances on the integrated circuit.

The line signal may be controlled in a variety of different ways, but is typically set by one of the drivers and reset by the other. This type of signaling is common and useful within integrated circuits. The present techniques are particularly useful in the context of memory circuits where long signal lines are common and circuit area and routing congestion problems can be severe.

Whilst the present technique is applicable to process geometries of a wide variety of sizes, it is particularly useful when the feature size becomes 90 nm or less.

Viewed from another aspect the present invention provides a method of controlling a line signal on a signal line within an integrated circuit, said method comprising the steps of:

in response to a first control signal, driving said line signal to a first signal level with a first signal driver circuit coupled to said signal line at a first location on said integrated circuit;

in response to a second control signal, driving said line signal to a second signal level different to said first signal level with a second signal driver circuit coupled to said signal line at a second location on said integrated circuit, said second location being separated from said first location with one or more further circuit elements disposed therebetween and said second signal driver circuit being;

in response to said first control signal and to said line signal, maintaining said signal line at said second signal level when said first signal driver circuit is not driving said signal line to said first signal level and said second signal driver circuit has driven said line signal to said second signal level using a first keeper circuit coupled to said signal line at said first location; and in response to said second control signal and said line signal, maintaining said signal line at said first signal level when said second signal driver circuit is not driving said signal line to said second signal level and said first signal driver circuit has driven said line signal to said first signal level using a second keeper circuit coupled to said signal line at said second location.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
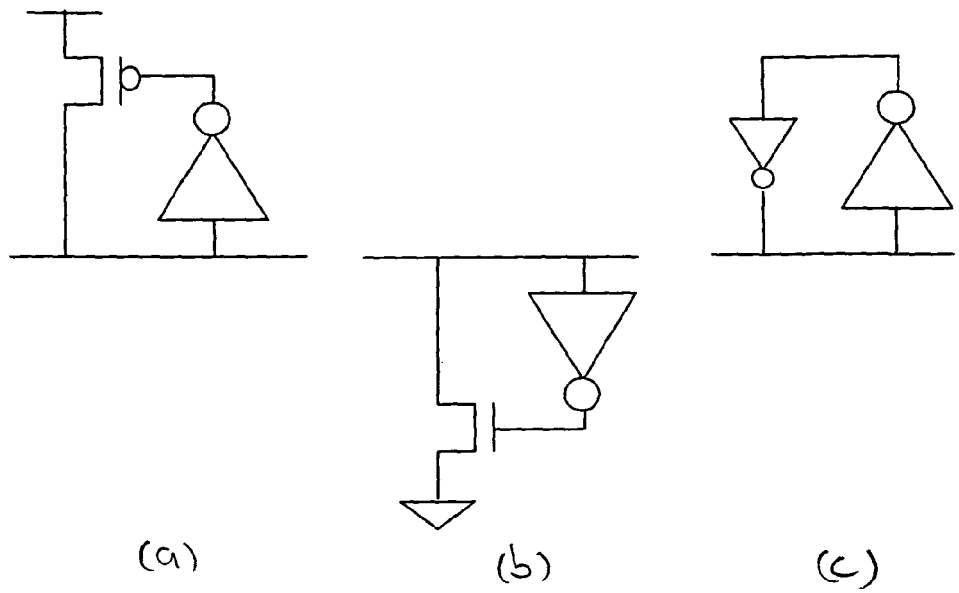
FIG. 1 schematically illustrates different types of keeper circuit and a jam latch.
Figure 2:
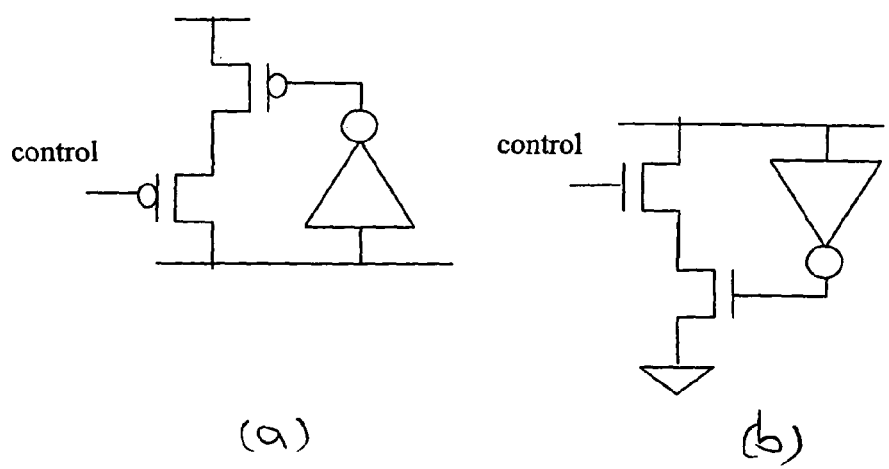
FIG. 2 schematically illustrates different types of keeper circuit which may be disabled by an appropriate control signal.
Figure 3:
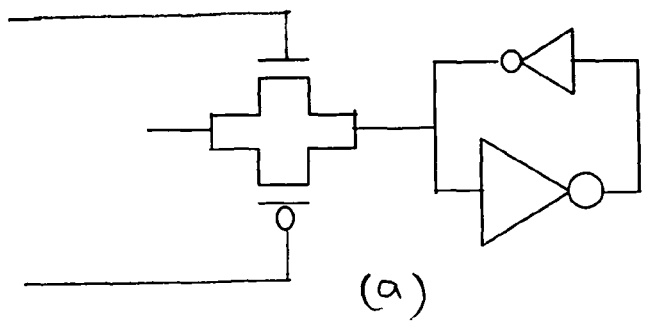
FIG. 3 illustrates a latch using cross-coupled invertors and a pass gate.
Figure 3:
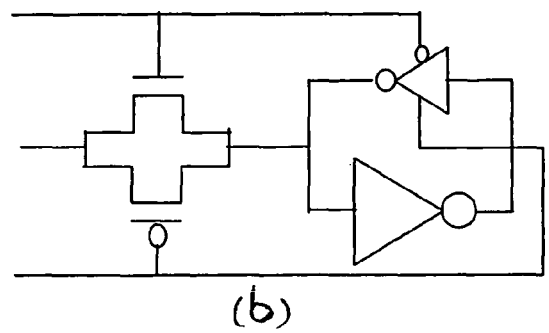
Figure 4:
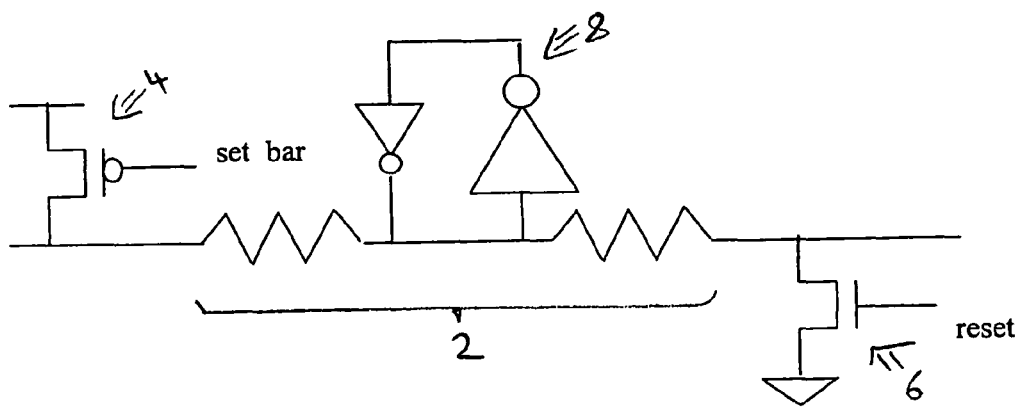
FIG. 4 illustrates a signal line having a jam latch disposed at a point along its length and with drivers at separated locations on the signal line serving to drive the signal line in opposite directions.
Figure 5:
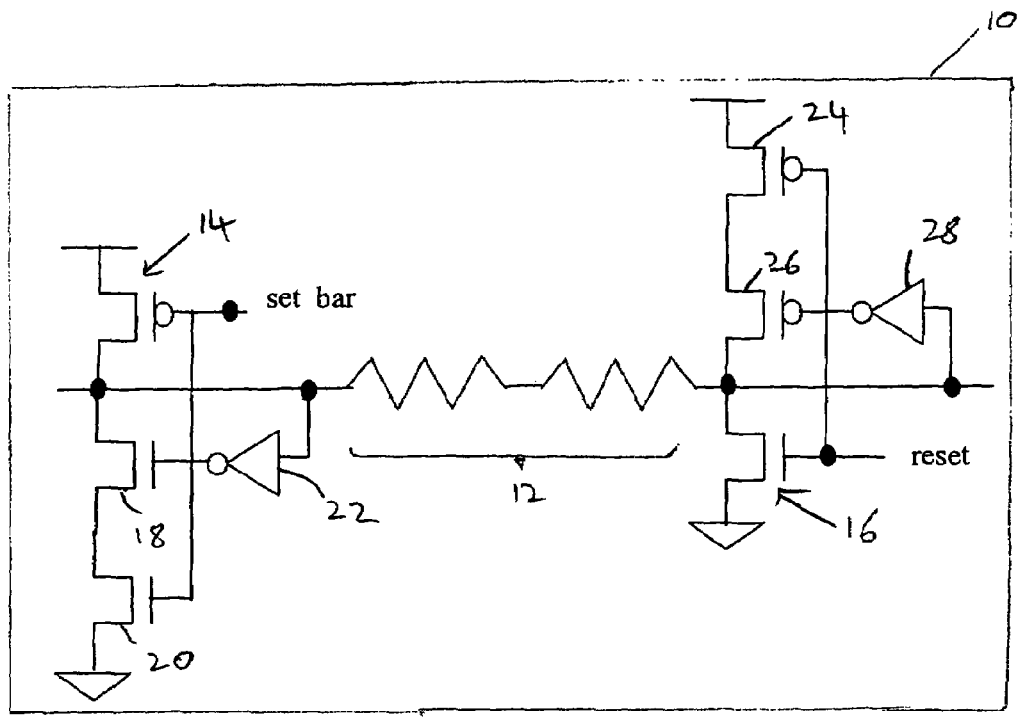
FIG. 5 illustrates an example embodiment of the present technique in which a signal line is provided with drivers at each end and a local keeper at each end.

FIG. 5 schematically illustrates an integrated circuit 10 which may be wholly or partially a memory circuit or another form of integrated circuit, and includes a signal line 12 carrying a line signal between different locations within the integrated circuit 10 separated by one or more intervening circuit elements. The signal line 12 distributes the line signal across the integrated circuit 10. This can be for many reasons, such as for distributing a control signal for coordinating activities.

A first driver 14 comprises a p-type transistor which will pull up the line signal to a high value when switched on. A second driver 16 is formed as an n-type transistor which will pull the line signal low when switched on. Associated with the first driver 14 is a first keeper circuit comprising n-type transistors 18, 20 and an invertor 22. A second keeper circuit comprising p-type transistors 24, 26 and an invertor 28 are associated with the second driver 16. The first keeper 18, 20, 22 serves to maintain the line signal value driven by the second driver 16 when the second driver 16 is no longer active in driving that signal. Conversely, the second keeper 24, 26, 28 serves to maintain the line signal value driven by the first driver 14 when the first driver 14 is no longer driving that signal value. The first keeper 18, 20, 22 is disabled by the set bar signal, which is also used to activate the first driver 14. Thus, the first keeper 18, 20, 22, will not contend (oppose the change of value being made) with the first driver 14 when the first driver 14 seeks to change the line signal value on the signal line 12. Similarly, the reset signal controlling the second driver 16 also serves to disable the second keeper 24, 26, 28 when the second driver 16 is active.

Figure 6:
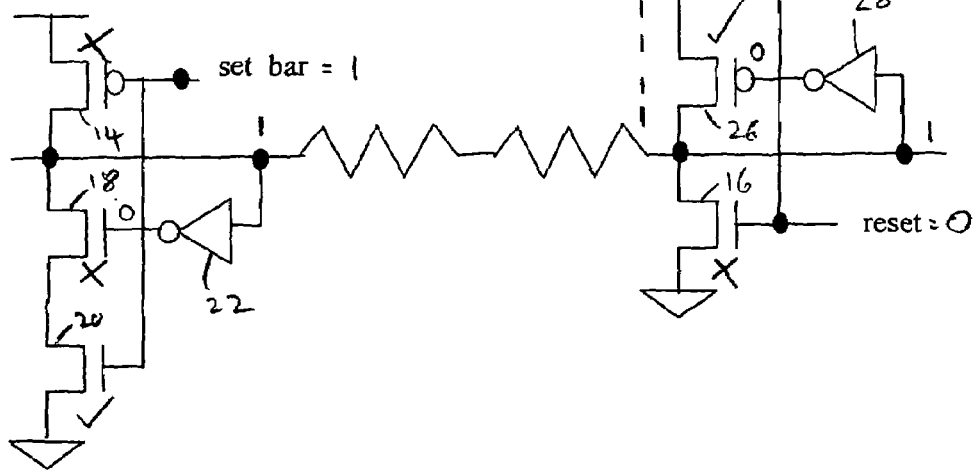
FIGS. 6 to 9 illustrate the operation of the circuit of FIG. 5.

FIG. 6 illustrates the static situation in which the signal line 12 is being held at a high line signal value. In this situation the transistors 24, 26 are switched on and the second keeper 24, 26, 28 is active in maintaining the line signal high. The second driver 16 is inactive since the reset signal is low. The first driver 14 is no longer driving the line signal and the first keeper 18, 20, 22 is inactive since the transistor 18 is switched off.

Figure 7:
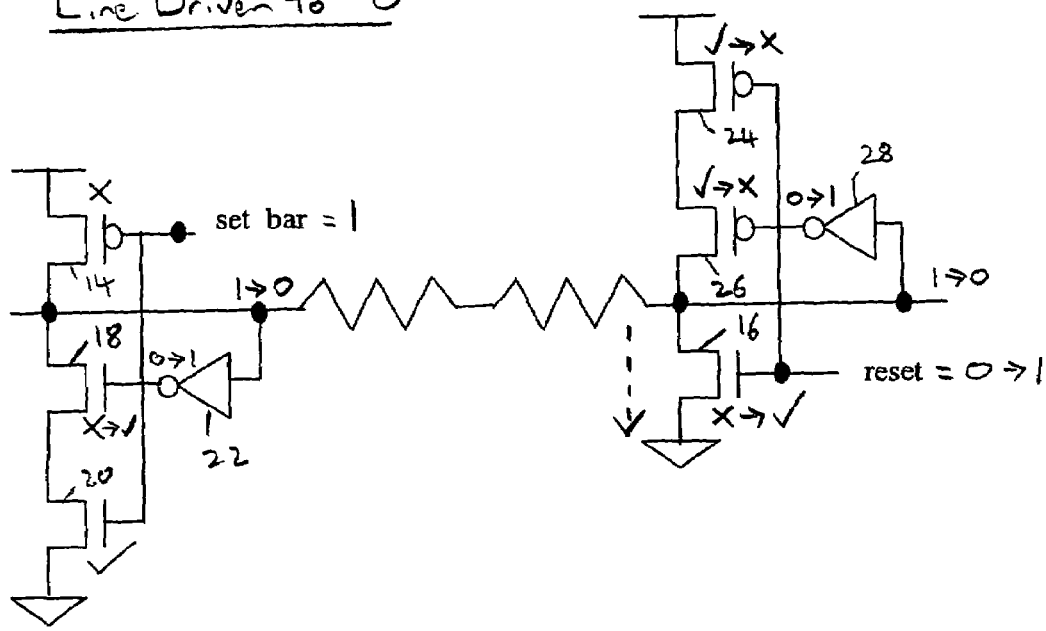

FIG. 7 illustrates the situation in which, starting from FIG. 6 state, the line signal is driven low. The reset signal transitions from low to high switching on the second driver 16 (the reset signal is pulsed high). This pulls the line signal value low. Simultaneously with the second driver 16 being switched on, the transition of the reset signal from low to high will also have the effect of switching off the second keeper 24, 26, 28 by switching off the transistor 24. The second keeper 24, 26, 28 will then not resist the change in the line signal from high to low and the transistor 26 will also switch off. At the same time, the change in the line signal from high to low has the effect of switching on transistor 18 within the first keeper 18, 20, 22. This first keeper 18, 20, 22 then becomes active and serves to maintain the line signal low when the second driver 16 is switched off (at the end of the pulse in the reset signal). The first driver 14 will be off during this time since the signal set bar is high (the set bar signal is also pulsed and is non-overlapping with the reset signal).

Figure 8:
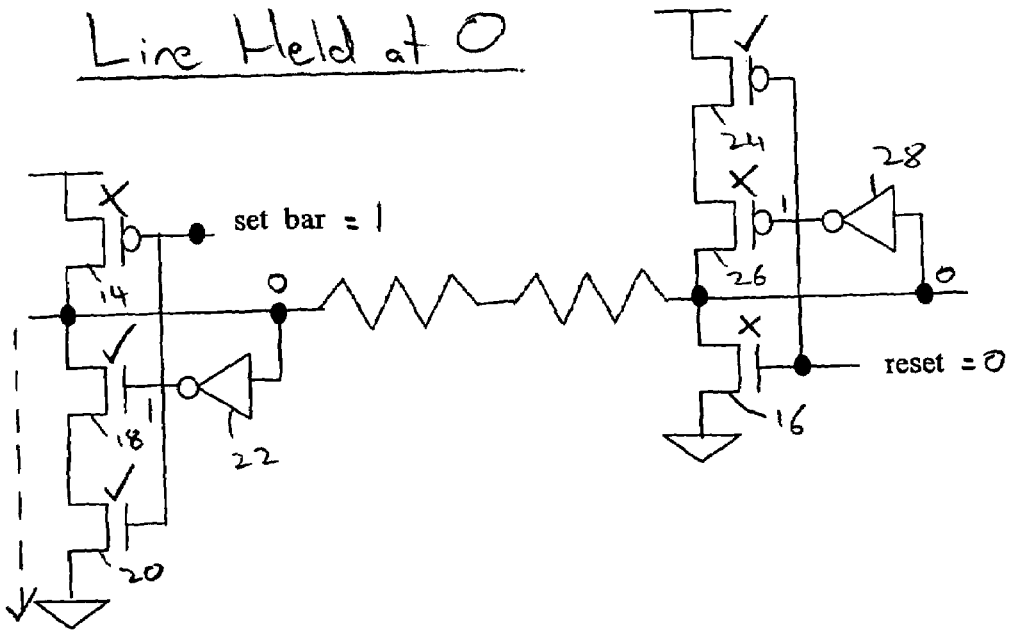

FIG. 8 illustrates the situation in which the line signal is held low following the second driver 16 being inactivated by the reset signal returning to a low (i.e. the end of its pulse). As mentioned above, transistors 18 and 20 are switched on and in conjunction with the invertor 22 serve to act as the first keeper maintaining the line signal low even though the second driver 16 is switched off.

Figure 9:
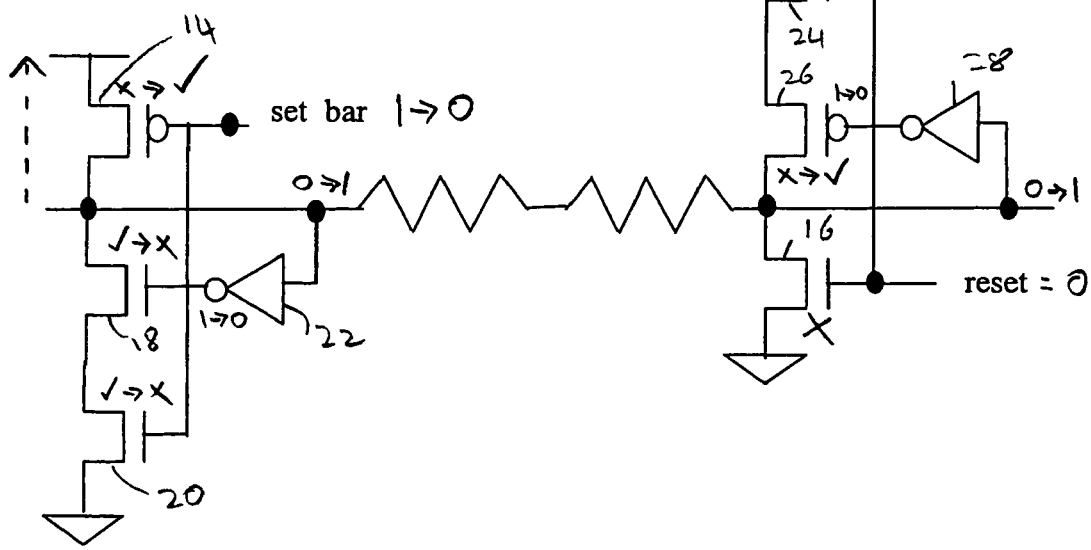

FIG. 9 illustrates the situation in which the line signal is driven from low to high. This is done by changing (pulsing) the set bar signal from high to low which turns on the first driver 14 and pulls the line signal high. At the same time, the change in the set bar signal from high to low turns off the transistor 20 which disables the first keeper 18, 20, 22 such that it does not contend with (fight) the change in the line signal being driven by the first driver 14.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
a signal line carrying a line signal;
a first signal driver circuit coupled to said signal line at a first location on said integrated circuit, said first signal driver circuit, responsive to a first control signal, configured to drive said line signal to a first signal level;
a second signal driver circuit coupled to said signal line at a second location on said integrated circuit, said second location being separated from said first location with one or more further circuit elements disposed therebetween, said second signal driver circuit, responsive to a second control signal, configured to drive said line signal to a second signal level different from said first signal level;
a first keeper circuit coupled to said signal line at said first location, said first keeper circuit, responsive to said first control signal and to said line signal, configured to maintain said signal line at said second signal level when said first signal driver circuit is not driving said signal line to said first signal level and said second signal driver circuit has driven said line signal to said second signal level; and
a second keeper circuit coupled to said signal line at said second location, said second keeper circuit, responsive to said second control signal and said line signal, configured to maintain said signal line at said first signal level when said second signal driver circuit is not driving said signal line to said second signal level and said first signal driver circuit has driven said line signal to said first signal level.

2. An integrated circuit as claimed in claim 1, wherein said second control signal is not available at said first location.

3. An integrated circuit as claimed in claim 1, wherein said first control signal is not available at said second location.

4. An integrated circuit as claimed in claim 1, wherein said line signal is set by said first driver circuit acting at said first location and is reset by said second driver circuit acting at said second location.

5. An integrated circuit as claimed in claim 1, wherein said first keeper circuit is enabled by said line signal having said second signal level to feedback said second signal level to said signal line.

6. An integrated circuit as claimed in claim 1, where said first keeper circuit is disabled by said first control signal having a level that activates said first driver circuit to drive said line signal to said first signal level.

7. An integrated circuit as claimed in claim 1, wherein said second keeper circuit is enabled by said line signal having said first signal level to feedback said first signal level to said signal line.

8. An integrated circuit as claimed in claim 1, where said second keeper circuit is disabled by said second control signal having a level that activates said second driver circuit to drive said line signal to said second signal level.

9. An integrated circuit as claimed in claim 1, comprising a memory circuit and wherein said first location and said second location are at different locations within said memory circuit and said line signal controls a memory access operation within said memory circuit.

10. An integrated circuit as claimed in claim 1, wherein said integrated circuit is formed with circuit elements having a feature size of 90 nm or less.

11. A method of controlling a line signal on a signal line within an integrated circuit, said method comprising the steps of:
in response to a first control signal, driving said line signal to a first signal level with a first signal driver circuit coupled to said signal line at a first location on said integrated circuit;
in response to a second control signal, driving said line signal to a second signal level different to said first signal level with a second signal driver circuit coupled to said signal line at a second location on said integrated circuit, said second location being separated from said first location with one or more further circuit elements disposed therebetween and said second signal driver circuit being;
in response to said first control signal and to said line signal, maintaining said signal line at said second signal level when said first signal driver circuit is not driving said signal line to said first signal level and said second signal driver circuit has driven said line signal to said second signal level using a first keeper circuit coupled to said signal line at said first location; and
in response to said second control signal and said line signal, maintaining said signal line at said first signal level when said second signal driver circuit is not driving said signal line to said second signal level and said first signal driver circuit has driven said line signal to said first signal level using a second keeper circuit coupled to said signal line at said second location.

12. A method as claimed in claim 11, wherein said second control signal is not available at said first location.

13. A method as claimed in claim 11, wherein said first control signal is not available at said second location.

14. A method as claimed in claim 11, wherein said line signal is set by said first driver circuit acting at said first location and is reset by said second driver circuit acting at said second location.

15. A method as claimed in claim 11, wherein said first keeper circuit is enabled by said line signal having said second signal level to feedback said second signal level to said signal line.

16. A method as claimed in claim 11, where said first keeper circuit is disabled by said first control signal having a level that activates said first driver circuit to drive said line signal to said first signal level.

17. A method as claimed in claim 11, wherein said second keeper circuit is enabled by said line signal having said first signal level to feedback said first signal level to said signal line.

18. A method as claimed in claim 11, where said second keeper circuit is disabled by said second control signal having a level that activates said second driver circuit to drive said line signal to said second signal level.

19. A method as claimed in claim 11, wherein said integrated circuit includes a memory circuit, said first location and said second location are at different locations within said memory circuit and said line signal controls a memory access operation within said memory circuit.

20. A method as claimed in claim 11, wherein said integrated circuit is formed with circuit elements having a feature size of 90 nm or less.

* * * * *